United States Patent [19]

Lehmann et al.

[11] Patent Number: 4,491,892
[45] Date of Patent: Jan. 1, 1985

[54] ELECTRONIC CURRENT OVERLOAD PROTECTION INSTALLATION

[75] Inventors: Ulrich Lehmann, Weissach; Rudolf Gabriel, Gerlingen, both of Fed. Rep. of Germany

[73] Assignee: Dr. Ing. h.c.F. Porsche AG, Stuttgart, Fed. Rep. of Germany

[21] Appl. No.: 426,922

[22] Filed: Sep. 29, 1982

[30] Foreign Application Priority Data

Sep. 29, 1981 [DE] Fed. Rep. of Germany ....... 3138645

[51] Int. Cl.³ .............................................. H02H 3/08
[52] U.S. Cl. ........................................ 361/101; 361/91
[58] Field of Search ...................... 361/91, 94, 98, 29, 361/100, 101; 307/299 A, 299 B, 300

[56] References Cited

U.S. PATENT DOCUMENTS 4,047,233 9/1977 Yorks et al. .................... 361/101 X
4,355,342 10/1982 Franzolini ...................... 361/101 X
4,363,068 12/1982 Burns ............................. 361/100 X

FOREIGN PATENT DOCUMENTS 1084820 7/1960 Fed. Rep. of Germany ...... 361/101
2323934 11/1974 Fed. Rep. of Germany ...... 361/101

OTHER PUBLICATIONS

"Electronic Circuit Breaker is Resettable"–Control Engineering, Sep. 1971, vol. 18, No. 9.

Primary Examiner—Harry E. Moose, Jr.
Attorney, Agent, or Firm—Craig & Burns

[57] ABSTRACT

An electronic current overload protection device in which an applied voltage is divided into the voltage across the load and the current-proportional voltage drop at an MOS transistor of a circuit that includes the load and the MOS transistor whose resistance is exactly linearly proportional to the current; this voltage drop is applied by way of a delay circuit to a threshold switch that controls the gate input of the MOS transistor by way of a driver stage; the threshold of the threshold circuit is adjustable corresponding to the current to be protected against.

4 Claims, 1 Drawing Figure

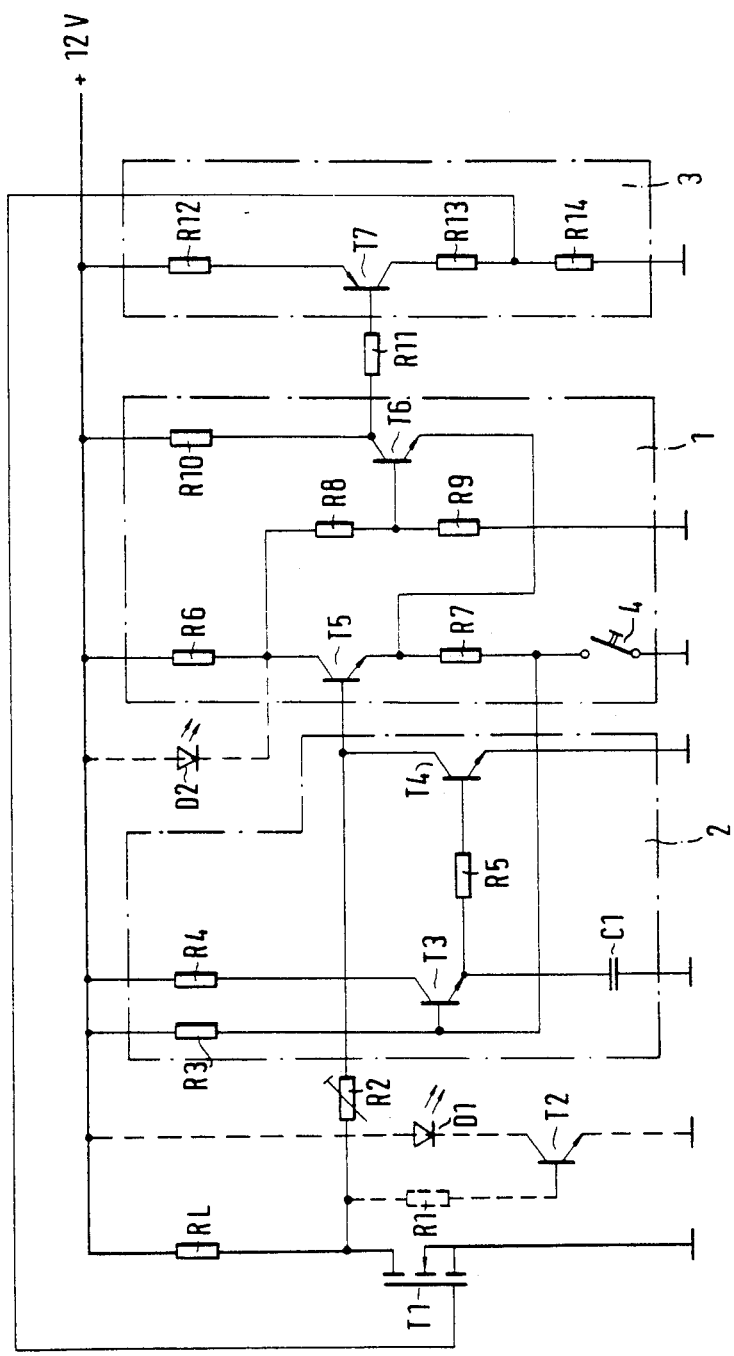

ELECTRONIC CURRENT OVERLOAD PROTECTION INSTALLATION

The present invention relates to an electronic current overload protection device with an MOS transistor connected as resistance and with an electronic threshold switch.

It is known from the German Offenlegungsschrift No. 25 39 911 to use MOS transistors for a threshold switch in integrated MOS circuits which are connected as resistances. By means of this circuit, the threshold switch it to be rendered far-reachingly independent of the value of the threshold voltage of the switching transistors.

In the German Offenlegungsschrift No. 27 07 455, an electronic overload current trigger device is connected with a switch interconnected into the load circuit between current source and load. A measuring switch determining the current in the load circuit controls the switch constructed as transistor in the load circuit as soon as overload currents occur. This circuit is quite expensive and since it is constructed as integrated circuit, does not offer the possibility to realize further measuring and monitoring functions.

In contrast thereto, it is the object of the present invention to provide as current overload protection device a circuit which is simple and low-cost in construction.

The underlying problems are solved according to the present invention in that the MOS transistor which has a resistance linearly proportional to the current is connected to the power supply in series with the load; the threshold switch is connected by way of a delay circuit with the line from the load to the MOS transistor and the threshold switch controls the gate input of the MOS transistor by way of a driver stage. In the circuit formed by the load and the MOS transistor with accurately linear characteristics, an applied voltage is divided into the voltage across the load and the voltage drop at the transistor, which serves as measuring magnitude for the control of a threshold switch which in turn controls the gate input of the MOS transistor by way of a driver stage.

In the normal condition of the circuit, the operating voltage of the power supply of, for example 12 volts is applied directly across the MOS transistor. Since the triggering voltage lies at about 1 volt, the operating voltage would prevent without additional measures a starting of the operation.

For this reason and because of the high starting currents of different loads, a delay circuit is connected in the input of the threshold switch which assures an adjustable response time for the triggering of the threshold switch.

These and other objects, features and advantages of the present invention will become more apparent from the following description when taken in connection with the accompanying drawing which shows, for purposes of illustration only, one embodiment in accordance with the present invention, and wherein:

The single FIGURE is a schematic circuit diagram of a current overload protection circuit in accordance with the present invention.

Referring now to the single FIGURE of the drawing, a threshold switch 1 is connected by way of a delay circuit 2 to a line from a load RL, that is itself connected with the other terminal to the operating voltage of +12 volts, to the drain connection of an MOS transistor T1. A Schmitt-trigger multivibrator which includes the transistors T5 and T6, the resistances R6, R7, R8, R9 and R10 as well as a push-button switch 4 serves as threshold switch 1. A driver stage 3 connected in the output of the multivibrator by way of a resistance R11 consists of the transistor T7 and the resistances R12, R13 and R14. It serves to reverse the polarity and to control the MOS transistor T1 by way of the connection from the point between resistances R13 and R14 and the source gate of the MOS transistor T1.

The magnitude of the theshold value is adjustable at a variable resistance R2 which is connected between the base of the transistor T5 and a point in the line from the load RL to the MOS transistor T1. The connections of the delay circuit 2 at the threshold switch 1 are located between the resistance R2 and the base of the transistor T5 as well as between the resistance R7 and the push-button switch 4. The delay circuit 2 consists of the transistor T3 and T4, of a resistance R5 connected therebetween and of a condenser C1 connected to the emitter of the transistor T3 as well as of the resistances R3 and R4, of which one is coordinated to the collector and the other to the base of the transistor T3.

When turning on the circuit by means of the push-button switch 4, the transistor T5 is blocked with the aid of the transistors T4 and T3 for such length of time until the starting current peaks of the load RL have died down. The discharge of the condenser C1 determines the response period, whereby the condenser C1 is connected to the operating voltage by way of the transistor T3 and is constantly charged. Upon actuation of the push-button switch 4, the transistor T3 is blocked (rendered nonconductive) and thus the condenser C1 discharges by way of resistance R5 and keeps the transistor T4 conducting for such length of time until the voltage drops below its threshold voltage. Only then can the threshold circuit possibly be triggered by overload currents.

A circuit formed by a transistor T2, a light-emitting diode (LED) D1 and a resistance R1 serve for the purpose of monitoring and indicating the operating current. The voltage drop across transistor T1 is measured by means of the transistor T2 whose base is connected by way of the resistance R1 with the drain connection of the MOS transistor T1; this voltage drop causes the diode D1 built into the collector line of transistor T2 to light up. The light intensity of the diode D1 is determined by selection of the resistance R1.

For purposes of indicating an overload current, a light-emitting diode (LED) D2 is used which, in parallel with the resistance R6, is connected between the +12 volt terminal of the operating voltage and the collector of transistor T5. The overload current triggering or a short circuit causes a higher voltage to appear at the transistor T1. If the threshold circuit has been triggered, the operating voltage is applied at the transistor T1. In this case, the transistor T5 remains conductive continuously, the threshold circuit is self-holding and the diode D2 lights up permanently.

While we have shown and described only one embodiment in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. An electronic overload current protection device, comprising MOS transistor means for controlling current passed therethrough by being operated as resistance, delay circuit means, a driver stage, electronic threshold switch means, and a power supply, wherein the MOS transistor means which has a resistance substantially linearly proportional to current, is connected to the power supply in series with a load means, the threshold switch means being operatively connected to the delay circuit means and to a junction between the load means and the MOS transistor means for controlling the gate input of the MOS transistor means through said driver stage, thereby to delay the application of said power supply to said load means for a predetermined time period.

2. A device according to claim 1, wherein the threshold switch means is constructed as multivibrator including further transistor means wherein an output signal of the multivibrator is reversed by a transistor of the driver stage.

3. A device according to claim 2, wherein a power-indicating transistor with light-emitting diode connected to the collector thereof serves as operating current indicating means, the base of the power-indicating transistor being connected with the drain electrode of the MOS transistor means.

4. A device according to claim 1 or 2, wherein a light-emitting diode is connected to the collector of the further transistor means of the multivibrator for indicating the overload current with concurrent self-holding of the threshold switch means.

* * * * *